(12) United States Patent
Kawakami

(10) Patent No.: US 6,558,508 B1
(45) Date of Patent: May 6, 2003

(54) PROCESSING APPARATUS HAVING DIELECTRIC PLATES LINKED TOGETHER BY ELECTROSTATIC FORCE

(75) Inventor: Satoru Kawakami, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/655,780

(22) Filed: Sep. 6, 2000

Related U.S. Application Data (63) Continuation of application No. PCT/JP99/02343, filed on Apr. 30, 1999.

(30) Foreign Application Priority Data

Oct. 29, 1998 (JP) ............................................. 10-324533

(51) Int. Cl.[7] .............................. C23C 16/00; C23F 1/00
(52) U.S. Cl. .............. 156/345.51; 118/728; 118/723 E; 361/234; 279/128
(58) Field of Search ................ 118/723 E, 723 ER, 118/728, 723 R, 723 MW, 723 MR, 723 ME, 723 MA, 723 I, 723 IR, 723 AN; 156/345, 345.43, 345.44, 345.45, 345.46, 345.47, 345.51, 345.52, 345.53, 345.41, 345.48; 361/234; 279/128

(56) References Cited

U.S. PATENT DOCUMENTS 5,290,381 A * 3/1994 Nozawa et al. .............. 156/345

FOREIGN PATENT DOCUMENTS

JP 10-223621 8/1998

\* cited by examiner

*Primary Examiner*—Luz L. Alejandro
(74) *Attorney, Agent, or Firm*—Finnegan, Henderson, Farabow, Garrett & Dunner LLP (57) ABSTRACT

In a vacuum processing apparatus for a semiconductor wafer, two intermediate dielectric plates 4A and 4B are provided on an upper surface of a cooling portion 31 provided with a coolant passageway 32, with an o-ring 35 therebetween, and a dielectric plate 5 is provided on the top thereof. Electrodes 41 and 51 are embedded in surface portions of each of these dielectric plates 4A, 4B, and 5, and heaters 42 and 52 are embedded in interior portions thereof. The intermediate dielectric plates 4A and 4B are linked together by electrostatic force, as are the intermediate dielectric plate 4B and the dielectric plate 5. Thus any gaps in a vacuum environment that are formed between adjacent components in these linkage regions are either eliminated or reduced.

16 Claims, 10 Drawing Sheets

Prior Art

US 6,558,508 B1

PROCESSING APPARATUS HAVING DIELECTRIC PLATES LINKED TOGETHER BY ELECTROSTATIC FORCE

This application is a continuation of PCT/JP99/02343, filed on Apr. 30, 1999.

TECHNICAL FIELD

The present invention relates to an apparatus for performing vacuum processing on a substrate to be processed, such as a semiconductor wafer, on a mounting stand that electrostatically attracts the substrate.

BACKGROUND ART

Steps for forming an integrated circuit on a semiconductor wafer include film formation and etching steps. In such vacuum processing, a wafer is mounted on a mounting stand within a vacuum chamber, but it is necessary to press the wafer onto the mounting stand to ensure that the wafer is maintained uniformly at a predetermined temperature by a temperature adjustment means that is provided in the mounting stand. Since it is not possible to use a vacuum chuck within a vacuum, means such as an electrostatic chuck is used to attach and hold the wafer to the surface of the mounting stand by electrostatic force.

Figure 13:
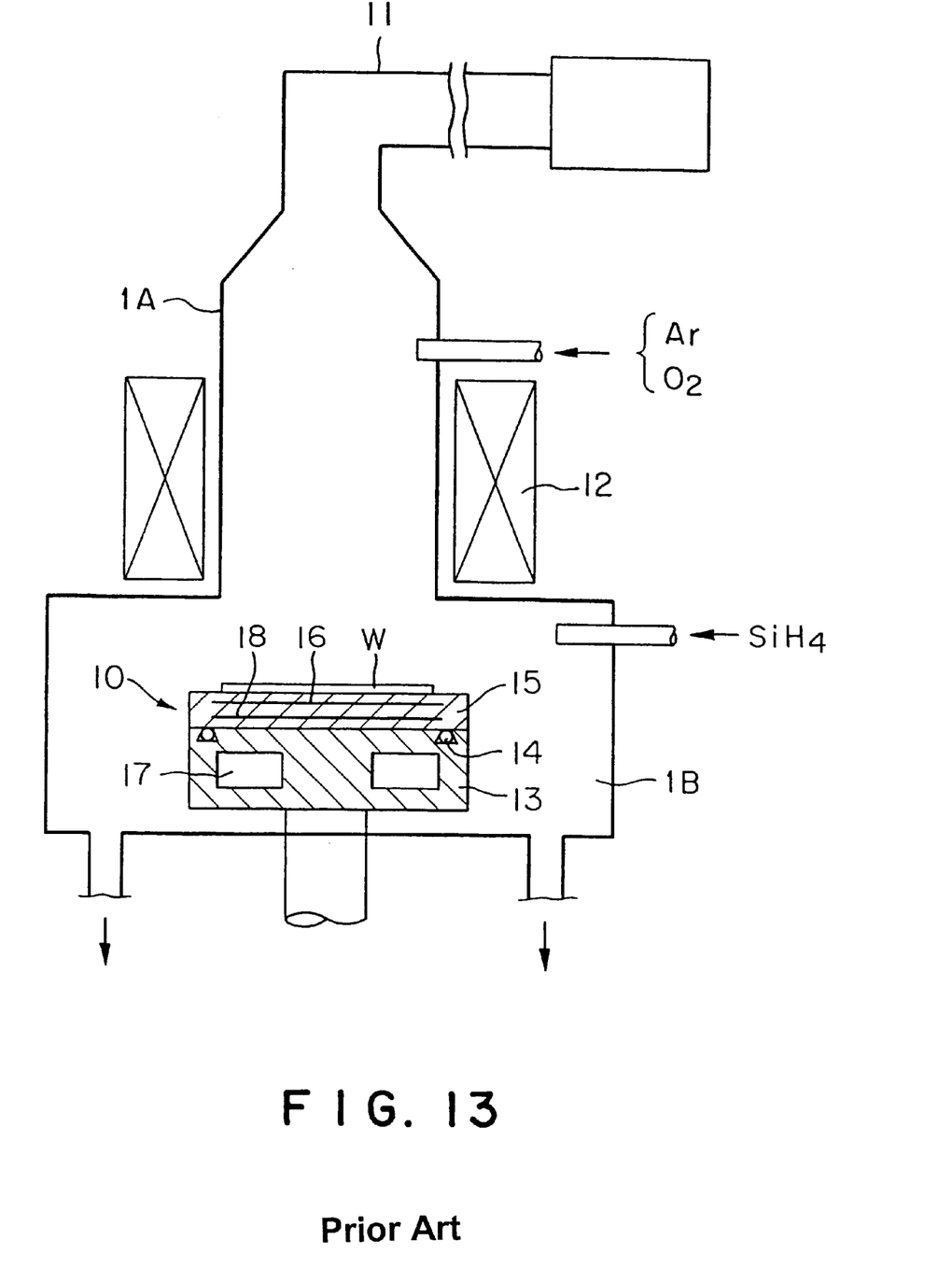
FIG. 13 is a section through a prior-art ECR plasma apparatus.

The overall configuration of a plasma apparatus that uses electron cyclotron resonance (ECR), including a mounting stand, is shown in FIG. 13 by way of an example of a vacuum processing apparatus. This vacuum processing apparatus is configured in such a manner that microwaves at, for example, 2.45 GHz are supplied into the interior of a plasma generation chamber 1A, and a magnetic field of, for example, 875 Gauss is applied thereto by an electromagnetic coil 12, so that the mutual interaction between the microwaves and the magnetic field causes a high-density plasma to be formed from a plasma gas such as Ar or $O_2$, to activate a film-formation gas such as $SiH_4$ that has been introduced into a film-formation chamber 1B, thereby forming a film on a wafer W.

A mounting stand 10 is configured of a dielectric plate 15 provided on the upper surface of a main mounting stand body 13 made of a material such as aluminum, with an O-ring 14 therebetween made of a plastic such as Viton or Kalrez (both products of E. I. du Pont de Nemours & Co. Inc.). An electrode 16 formed of a metal such as tungsten is provided in the interior of this dielectric plate 15 in the vicinity of the surface thereof, with the configuration being such that this surface portion acts as an electrostatic chuck. In addition, a coolant passageway 17 is provided in the main mounting stand body 13 and a heater 18 formed of an electrode of a metal such as tungsten is provided within the dielectric plate 15.

Since neither of the surfaces of the main mounting stand body 13 and the dielectric plate 15is a completely flat surface, slight gaps will be formed between them if they are simply superimposed. This mounting stand 10 is placed in a vacuum, however, so these gaps will act as thermal insulating regions. The reason why the O-ring 14 is interposed therebetween is to ensure that helium can be supplied to the region enclosed by the O-ring 14, thus guaranteeing uniform thermal transfer.

The thus configured mounting stand 10 is designed to attract and hold the wafer W to the surface of the mounting stand by electrostatic force, as previously described, but it also plays the role of heating the wafer W to a predetermined temperature. The surface of the main mounting stand body 13 is adjusted to 150° C. to obtain a reference temperature by passing coolant through a coolant passageway 17, and the temperature of the wafer is controlled to be constant by combining this action with that of the heater 18.

In the thus configured mounting stand 10, the O-ring 14 is provided between the main mounting stand body 13 and the dielectric plate 15, but this O-ring 14 is made of plastic and so has a temperature resistance of no more than 200° C., which means that it will deteriorate if the temperature increases any further, so that it will become impossible to maintain the sealing properties thereof. It is therefore not possible to increase the temperature of the surface of the dielectric plate 15 that is in contact with the O-ring 14 to above 200° C..

Since semiconductor devices are now being designed to operate at even faster speeds, there is a trend to form interlayer dielectric films of SiOF or $CF_x$, which have lower permittivities than $SiO_2$. Such an SiOF or $CF_x$ film can be formed by the above described ECR plasma apparatus, but the processing is at a higher temperature than that for an $SiO_2$ film and thus the surface of the dielectric plate 15 is required to be maintained at a temperature of 320 to 400° C. during the processing.

Since the dielectric plate 15 in this case is a sintered member, it is difficult to construct it to a greater thickness, so this thickness is limited to at most about a dozen mm. If the surface of the dielectric plate 15 of such a thickness is heated up to approximately 320° C., the temperature of the rear surface of the dielectric plate 15 will be approximately 300° C., which means that the above described mounting stand 10 cannot be used for such high-temperature processing.

The present invention was devised in the light of the above situation and has as an object thereof the provision of a vacuum processing apparatus that can support the provision of an O-ring or the like in the mounting stand during high-temperature processing, and which can also enable vacuum processing with a high level of surface uniformity.

DISCLOSURE OF THE INVENTION

The present invention achieves the above described object by providing a vacuum processing apparatus comprising a vacuum chamber and a mounting stand provided within the vacuum chamber for a substrate to be processed, wherein the mounting stand comprises a cooling portion having a cooling means and a dielectric plate provided on top of the mounting stand for supporting the substrate, and the supporting dielectric plate comprises a heater and an electrode that configures an electrostatic chuck for electrostatically attracting the substrate; wherein the vacuum processing apparatus further comprises: an intermediate dielectric plate linked to a surface of the cooling portion with an annular synthetic resin sealing member therebetween and having an electrode configuring the electrostatic chuck embedded in a surface thereof; and a system for supplying a fluid for thermal transfer into a region surrounded by the sealing member between the cooling portion and the intermediate dielectric plate; the supporting dielectric plate being linked to the surface of the intermediate dielectric plate by the electrostatic force of the electrostatic chuck of the intermediate dielectric plate.

The above described object of the present invention is also achieved by the provision of a vacuum processing apparatus comprising a vacuum chamber and a mounting stand provided within the vacuum chamber for a substrate to be processed, wherein the mounting stand comprises a cooling portion having a cooling means and a dielectric plate provided on top of the mounting stand for supporting the substrate, and the supporting dielectric plate comprises a heater and an electrode that configures an electrostatic chuck for electrostatically attracting the substrate; wherein the vacuum processing apparatus further comprises: an intermediate dielectric plate provided in contact with a surface of the supporting dielectric plate on the opposite side from a substrate support surface of the supporting dielectric plate; a system for supplying a fluid for thermal transfer to a linkage surface between the intermediate dielectric plate and the supporting dielectric plate; and a controller for adjusting a pressure of the fluid for thermal transfer to control the degree of thermal transfer between the intermediate dielectric plate and the supporting dielectric plate.

The above described object of the present invention is further achieved by the provision of a vacuum processing apparatus comprising a vacuum chamber and a mounting stand provided within the vacuum chamber for a substrate to be processed, wherein the mounting stand comprises a cooling portion having a cooling means and a dielectric plate provided on top of the mounting stand for supporting the substrate, and the supporting dielectric plate comprises a heater and an electrode that configures an electrostatic chuck for electrostatically attracting the substrate; wherein the vacuum processing apparatus further comprises: an intermediate dielectric plate provided in contact with a surface of the supporting dielectric plate on the opposite side from a substrate support surface of the supporting dielectric plate; and an electrode configuring an electrostatic chuck that is embedded in the intermediate dielectric plate, for linking together the cooling portion and the intermediate dielectric plate by electrostatic force.

BEST MODES FOR CARRYING OUT THE INVENTION

A first embodiment of the present invention is described below. The object of the vacuum processing apparatus of this embodiment is to ensure that there is no deterioration of the sealing member due to heat, even during high-temperature processing, while the uniformity of heat transfer between the intermediate dielectric plate and the dielectric plate is improved, by interposing an intermediate dielectric plate, in which is embedded an electrode for an electrostatic chuck, is interposed between an annular plastic sealing member and a dielectric plate, in which are embedded an electrode for an electrostatic chuck and a heating means, then linking together this intermediate dielectric plate and the dielectric plate by electrostatic force.

Figure 1:
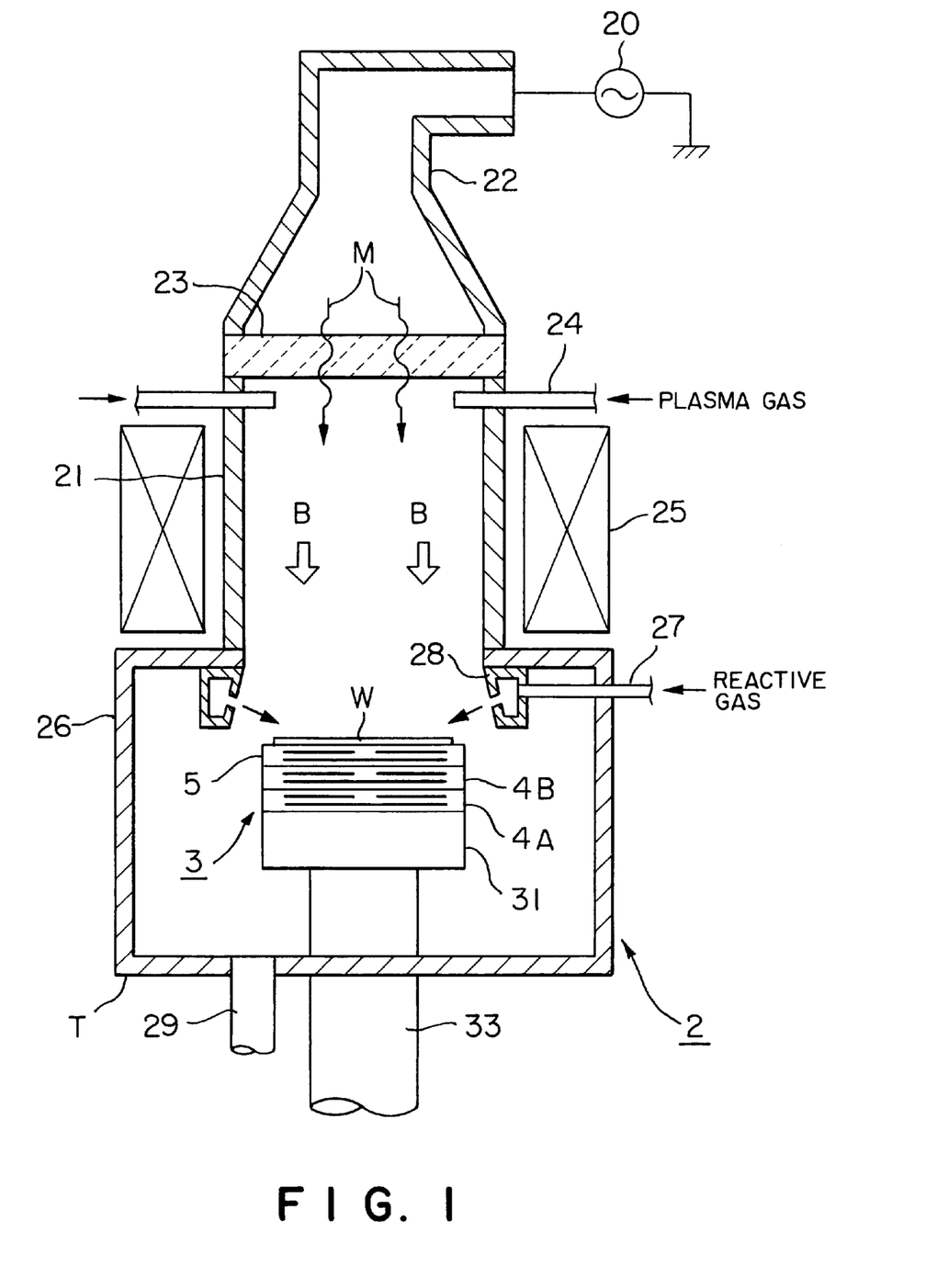
FIG. 1 is a section through a vacuum processing apparatus in accordance with a first embodiment of the present invention.
Figure 2:
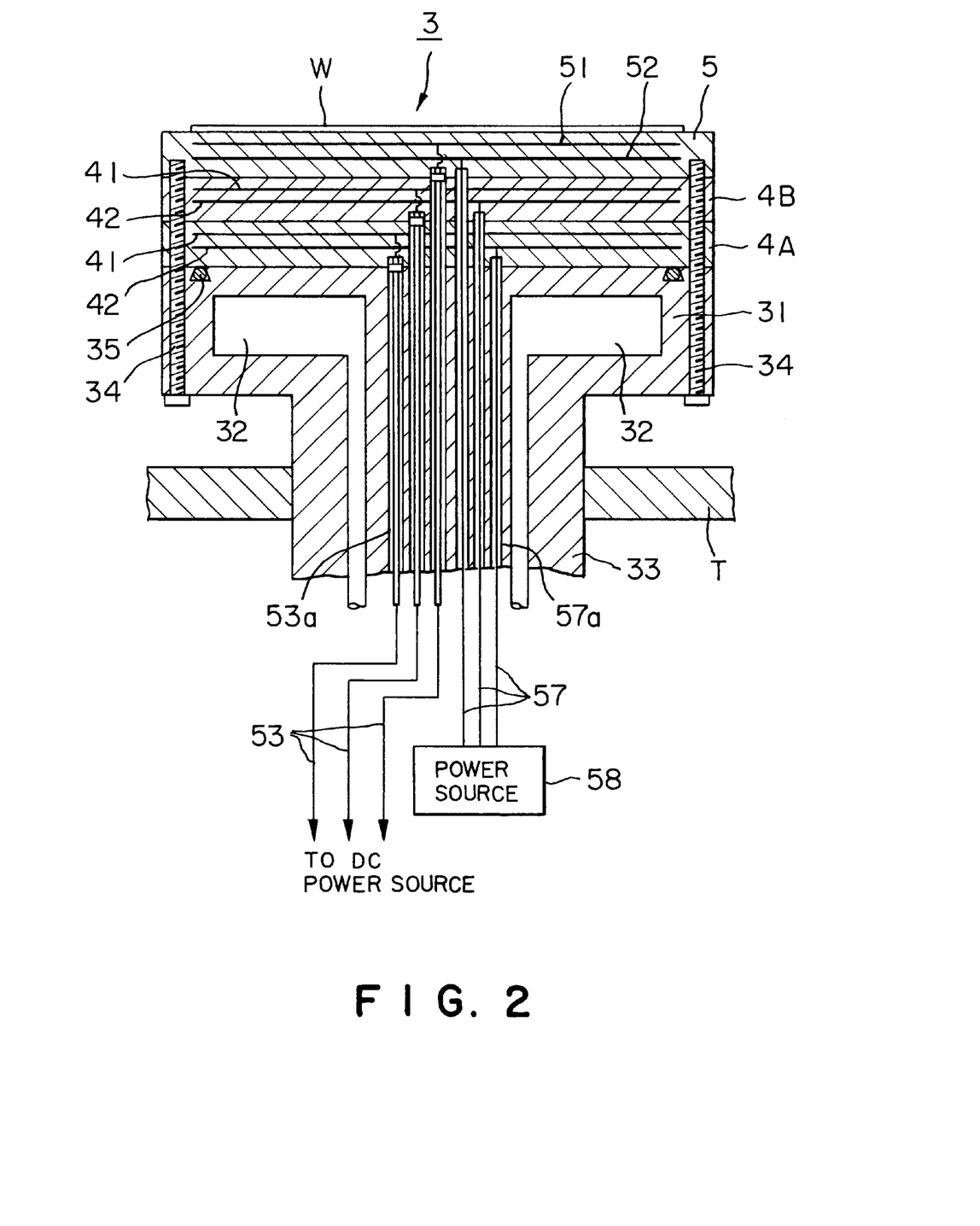
FIG. 2 is a section through an example of a mounting stand used in the vacuum processing apparatus of this invention.

A schematic section through an embodiment of the present invention applied to a vacuum processing apparatus, such as an ECR plasma apparatus, is shown in FIG. 1 and a section through the mounting stand for a substrate to be processed, such as a semiconductor wafer (hereinafter abbreviated to "wafer") is shown in FIG. 2. The description first deals with the overall configuration of the ECR plasma apparatus wherein microwaves M at, for example, 2.45 GHz from a radio-frequency power source 20 are guided from a waveguide 22 and through a transparent window 23 into a plasma chamber 21 on an upper side of a vacuum vessel 2, a plasma gas such as Ar or $O_2$ is also supplied into the plasma chamber 21 from a plasma gas nozzle 24, and then electronic cyclotron resonance is generated by the application of a magnetic field B from an electromagnetic coil 25 provided outside the plasma chamber 21. The configuration is further such that a reactive gas is supplied into a reaction chamber 26 at a lower side of the vacuum vessel 2 through a reactive gas supply member 28 provided with a reactive gas pipe 27. An exhaust pipe 29 is connected to a bottom portion of the reaction chamber 26.

A mounting stand 3 for holding a wafer that is the substrate to be processed is provided in a freely elevatable manner in the interior of the reaction chamber 26. This mounting stand 3 is provided with at least one intermediate dielectric plate, such as two intermediate dielectric plates 4A and 4B, that are stacked on top of a cooling portion 31, and a dielectric plate 5 for mounting the wafer W thereon is provided on the top surface thereof. Note that "dielectric" in this case could also include a semiconductor material in addition to the generally used insulating material. The thus configured mounting stand 3 is provided on an upper portion of a circular cylindrical support member 33, where this support member 33 is disposed in such a manner that it passes through a bottom wall T of the vacuum vessel 2 and it can be raised and lowered while a hermetic seal is maintained with respect to the vacuum vessel 2.

The mounting stand 3 will now be described in detail with reference to FIG. 2. The cooling portion 31 is made of a material such as aluminum and a coolant passageway 32 for circulating a coolant is provided in the interior thereof. The temperature of the coolant is adjusted precisely to be 150° C., by way of example, in order to ensure that the surface of the cooling portion 31 is kept at a uniform reference-temperature surface. The first intermediate dielectric plate 4A and the second intermediate dielectric plate 4B are provided in a stack on the upper surface of this cooling portion 31, with an O-ring 35 that forms a resin sealing member made of a synthetic resin such as Viton or Kalrez between the cooling portion 31 and the first intermediate dielectric plate 4A.

A heat-transfer gas such as helium is introduced into an air-tight region that is surrounded by the O-ring 35 between the plate 4A and the cooling portion 31, in a state in which it applies a positive pressure with respect to a vacuum environment, such as 200 Torr. This helium plays the role of ensuring that the heat between the cooling portion 31 and the first intermediate dielectric plate 4A is kept uniform.

The dielectric plates 4A, 4B and 5 are made of a dielectric material such as aluminum nitride (AlN) and are formed to a circular shape having a diameter of 196 to 205 mm (for the processing of an 8" wafer). An electrostatic chuck electrode 41 (or 51) of a material such as tungsten foil is embedded into each of these dielectric plates 4A, 4B, and 5 at positions close to the respective surfaces thereof so that those surface portions are configured as an electrostatic chuck, and also heaters 42 (or 52) formed of resistance heating elements are embedded therein.

Figure 3:
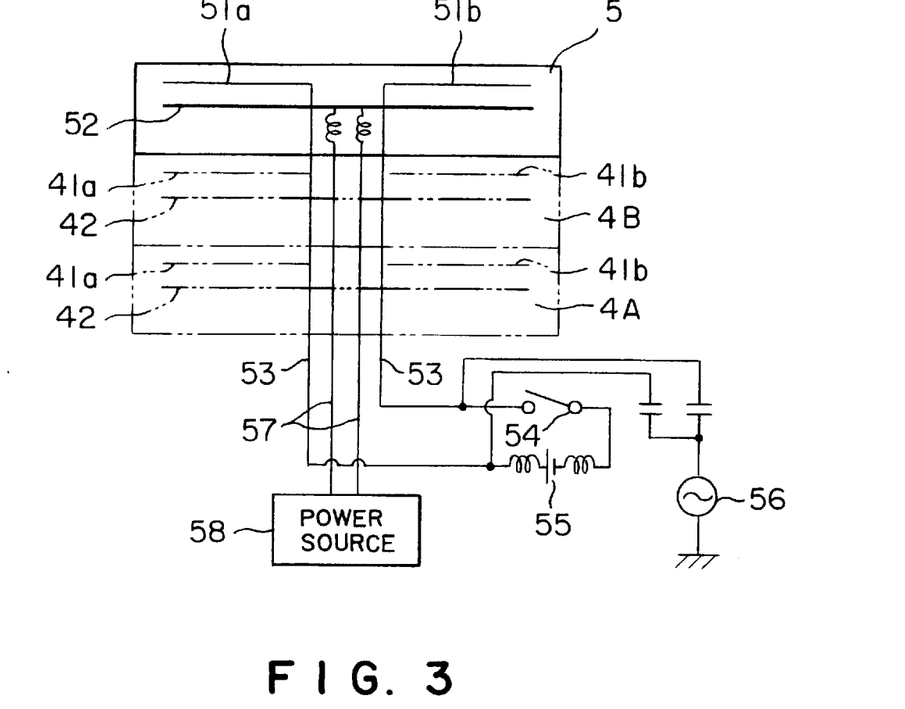
FIG. 3 is a section through part of the mounting stand.

The depiction of the electrodes 41 and 51 and the heaters 42 and 52 in FIGS. 1 and 2 has been omitted for the sake of convenience, but details of the dielectric plate 5 in practice as shown in FIG. 3 for reference. The electrode 51 (51a and 51b) is of a dipole-type, by way of example, and a direct-current power source 55 for the electrostatic chuck is connected to this electrode 51 by power supply lines 53 and a switch 54. In addition, a radio-frequency power source 56 is also connected to the electrode 51 in such a manner that a bias voltage for attracting ions to the wafer W is applied thereto. Power supply lines 57 are connected to the two ends of the resistance heating element that forms the heater 52, and a power source 58 is connected thereto by these power supply lines 57. Note that each of the power supply lines 53 and 57 is incorporated within a cylindrical sheath 53a or 57a, respectively, as shown in FIG. 2.

An electrode 41b that opposes the electrode 41a of the second intermediate dielectric plate 4B is embedded at a position near the surface on the rear side of the dielectric plate 5 (on the side towards the second intermediate dielectric plate 4B) and a direct-current power source for the electrostatic chuck is connected to that opposing electrode 41b. Similarly, an electrode 41a that oppose the electrode 41b of the first intermediate dielectric plate 4A is embedded at a position near the surface on the rear side of the second intermediate dielectric plate 4B (on the side towards the first intermediate dielectric plate 4A). This configuration ensures that electrostatic force is generated between the dielectric plate 5 and the second intermediate dielectric plate 4B and between the second intermediate dielectric plate 4B and the first intermediate dielectric plate 4A, so that electrostatic attraction is achieved. Even if there are no opposing electrodes provided on the rear surface sides of the dielectric plate 5 and the second intermediate dielectric plate 4B, the heaters 42 and 52 are provided in these plates so that electrostatic attraction is done by the heaters 42 and 52 and the electrodes 41.

This mounting stand 3 is configured in such a manner that the various components thereof are bolted together in a freely removable way by the engagement of screws 34 within threaded holes (not shown in the figures) that are formed in peripheral regions of the components, such a region thereof on the outer side of the electrodes 41 and the electrode 51, so as to pass through the cooling portion 31 and the first and second intermediate dielectric plates 4A and 4B as far as the lower side of the dielectric plate 5.

The description now turns to the operation of the above embodiment, taking as an example the formation of an SiOF film that is an interlayer dielectric film on the wafer W. First of all, a wafer W is transferred onto the dielectric plate 5 of the mounting stand 3, which is a transfer position for the wafer W, by a conveyor arm (not shown in the figure) from a load-lock chamber (not shown) by the cooperative action of lift pins (not shown) that are incorporated within the mounting stand 3, and the wafer W is attracted electrostatically onto that dielectric plate 5. The voltage of the electrodes 41 during that time is 1.5 kV, for example, and that of the electrode 51 is also 1.5 kv.

The mounting stand 3 is then raised by the support member 33 as far as a processing position, and the wafer W is heated to a predetermined temperature, such as 340° C. by the combined action of the coolant in the coolant passageway 32 and the heaters 42 and 52. At the same time, predetermined quantities of each of the plasma gas such as Ar or $O_2$ from the plasma gas nozzle 24 and the film-formation gas such as $SiF_4$ and $O_2$, from the reactive gas pipe 27 are introduced, while the interior of the vacuum vessel 2 is maintained at a predetermined degree of vacuum by the exhaust pipe 29, an SiOF film is formed on the wafer W by this reactive gas that has been activated by the plasma ions flowing into the reaction chamber 26.

Figure 4:
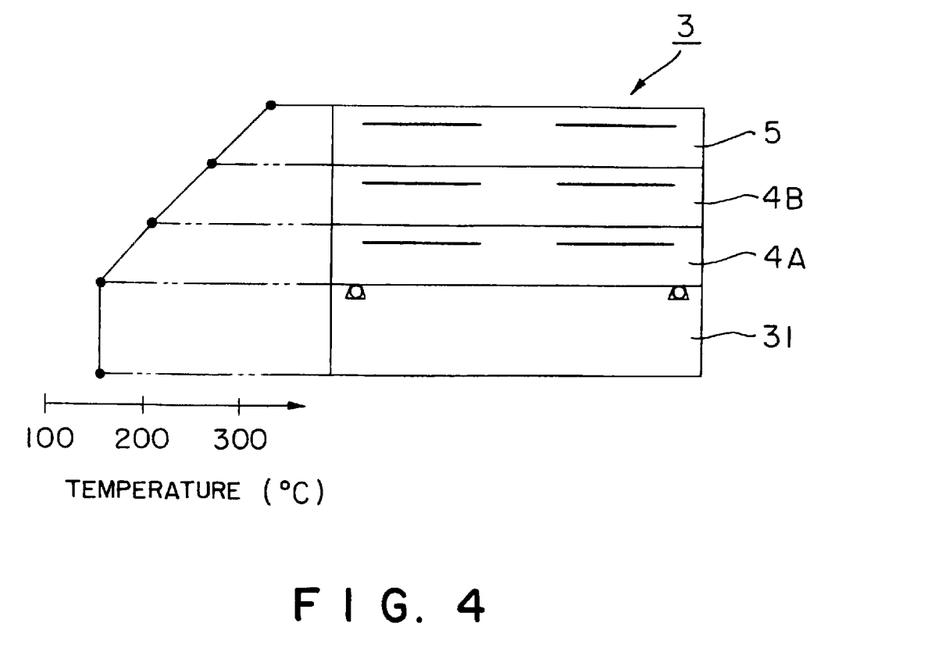
FIG. 4 is a view illustrating the temperature of the mounting stand during the formation of an interlayer dielectric film.

During this time, the temperature of the surface of the cooling portion 31 is adjusted to 150° C. by the coolant, while the surface of the first intermediate dielectric plate 4A is adjusted by the heater 42 to a temperature such as approximately 200° C., the surface of the second intermediate dielectric plate 4B is adjusted by the heater 42 to a temperature such as approximately 270° C., and the surface of the dielectric plate 5 is adjusted by the heater 52 to a temperature such as approximately 340° C., as shown in FIG. 4.

In this case, the O-ring 35 is provided between the cooling portion 31 and the first intermediate dielectric plate 4A and heat is transferred uniformly by the helium, as described previously, but it is not possible to use this O-ring 35 between the first intermediate dielectric plate 4A and the second intermediate dielectric plate 4B and between the second intermediate dielectric plate 4B and the dielectric plate 5 because those dielectric plates are at temperatures of at least 200° C., so that heat is transferred by direct surface contact between those dielectric plates.

Figure 5A:
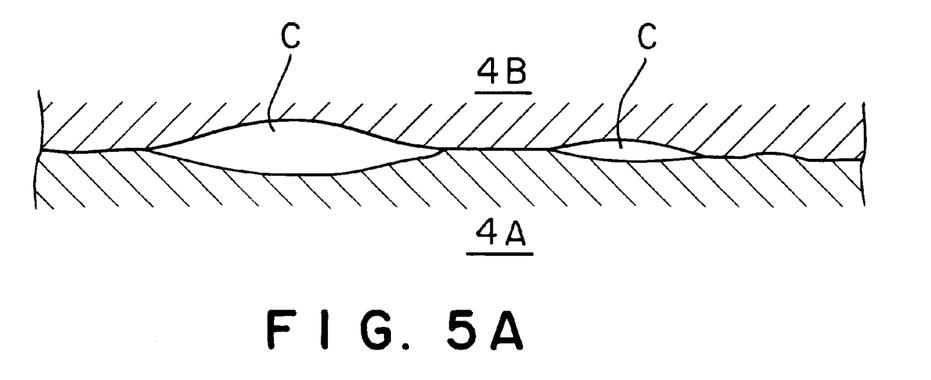
FIGS. 5A and 5B are views illustrating the operation of the mounting stand.

The dielectric plates are linked together by screws in this embodiment, but, since the surfaces of the dielectric plates are not completely flat, very small gaps C are formed between adjacent plates which means that the bolting together of the peripheral regions weakens the connective strength of the central region in comparison with that of the peripheral regions, so that those gaps C become larger in the central region, as shown in FIG. 5A, taking the first and second intermediate dielectric plates 4A and 4B as a representative example.

Figure 5B:
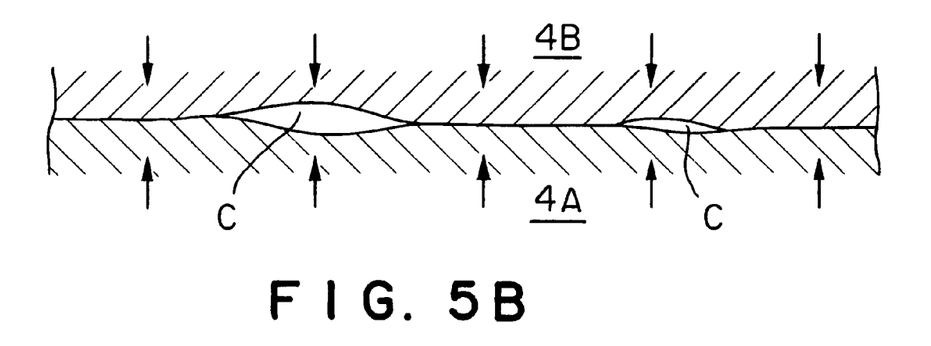

In this embodiment of the present invention, the first and second intermediate dielectric plates 4A and 4B are linked toghether and the second intermediate dielectric plate 4B and the dielectric plate 5 are linked together by electrostatic force so that the intermediate dielectric plates 4A and 4B are pulled together by the electrostatic force and thus the gaps C between these plates 4A and 4B become smaller as indicated in FIG. 5B.

Since the gaps in the linkage portions of the dielectric plates 4A, 4B, and 5 are in a vacuum environment, substantially no heat is transferred through those portions, thus worsening the in-surface uniformity of thermal transfer between locations that are in contact and locations that are not in contact. For that reason, the in-surface uniformity of thermal transfer is better when the gaps are smaller and, as a result, it becomes possible to make the temperature of the surface of the dielectric plate 5 more uniform and thus enable vacuum processing with a high level of in-surface uniformity.

When the dielectric plates 4A, 4B, and 5 are linked together by screws, a large connective force is obtained by the screws in the peripheral regions and also a large connective force is obtained by the electrostatic force in the central region, in which the electrodes 41 and 51 are provided further inward than the screws 34, so that a large connective force can be obtained over the entire surface. This ensures that any gaps in the linkage portions of the various dielectric plates 4A, 4B, and 5 are made smaller over the entire surfaces thereof, thus increasing the in-surface uniformity of thermal transfer. This form of linking by screws is considered to be more effective, but it should be noted that this embodiment of the invention is not necessarily limited to connection by screws.

In addition, the heaters 42 and 52 are provided in the first and second intermediate dielectric plates 4A and 4B and the dielectric plate 5 so that the temperatures of the dielectric plates 4A, 4B, and 5 can be controlled independently, making it easy to ensure that the heat transfer between those plates is uniform. This is because, although it is not possible to make the transfer of heat completely uniform between locations in the linkage surfaces of the plates where there are gaps and locations where there are no gaps, the plates themselves can be heated by the heaters incorporated therein so that the temperature of the surface (or rear surface) of each of the plates can be made uniform to a certain degree. This means that the temperature gradient between plates (in other words, the temperature gradient of adjacent surfaces towards the linkage portion thereof) can be controlled and thus the difference in thermal transfer can be restrained to a small value by this reduction in the temperature gradient, making it possible to increase the in-surface uniformity of thermal transfer and thus enable vacuum processing with a high degree of in-surface uniformity.

Further additionally, if only the heater 52 in the dielectric plate 5 is provided and an attempt is made to heat the surface of the dielectric plate 5 up to the predetermined temperature, there will be a large temperature gradient between the dielectric plate 5 and the intermediate dielectric plates 4A and 4B so that the amount of heat transferred to the second intermediate dielectric plate 4B and other components will also be large and thus it will be fairly difficult to raise the temperature of the surface of the dielectric plate 5. However, if the heaters 42 are also provided in the intermediate dielectric plates 4A and 4B so that those plates can be heated to their predetermined temperatures, the temperature gradient between the dielectric plate 5 and the second intermediate dielectric plate 4B is small even in the initial stages of the heating, which reduces the amount of heat transferred to the plate 4B by an equivalent amount and thus shortens the time required until the dielectric plate 5 stabilizes at the predetermined temperature. It is therefore effective to provide the heaters 42 in the intermediate dielectric plates 4A and 4B as well, as in this embodiment of the invention.

With the thus-configured mounting stand 3 in accordance with this embodiment of the invention, it is possible to increase the temperature difference between the O-ring 35 and the wafer W by interposing the first and second intermediate dielectric plates 4A and 4B and the dielectric plate 5 between the O-ring 35 and the wafer W, then controlling the temperatures of the dielectric plates in such a manner that the temperature increases with closeness to the wafer W. During this time, there is a temperature gradient within the mounting stand 3 such that the temperature becomes lower from the dielectric plate 5 towards the cooling portion 31, reducing the temperature within each dielectric plate from the main surface side to the rear surface side thereof.

It is therefore possible to ensure that the temperature of the intermediate dielectric plate 4A that is in contact with the O-ring 35 is no more than 200° C., while the mounting surface for the wafer W is at 340° C., which is higher than 300° C. Since this ensures that the O-ring 35 is interposed between a surface at no more than 200° C. and a surface at 150° C. (the surface of the cooling portion 31), the O-ring 35 itself is at a much lower temperature than 200° C., making it possible to prevent degradation of the O-ring 35 and, as a result, maintain the sealing abilities thereof.

If the linkage between the first and second intermediate dielectric plates 4A and 4B were made to have the same configuration as that used between the dielectric plate 5 and the cooling portion 31 in a prior-art apparatus (a configuration in which the first and second intermediate dielectric plates 4A and 4B are not used), the dielectric plate 5 at a temperature of at least 300° C. would be linked to the surface of the cooling portion 31 (in other words, the reference cooling surface at 150° C. that forms a reference for temperatures within the apparatus). Since this means that a huge amount of heat is transferred directly to the reference cooling surface from the dielectric plate 5 and thus the uniformity of the temperature of that reference cooling surface is destroyed and temperature adjustment becomes difficult.

Figure 6:
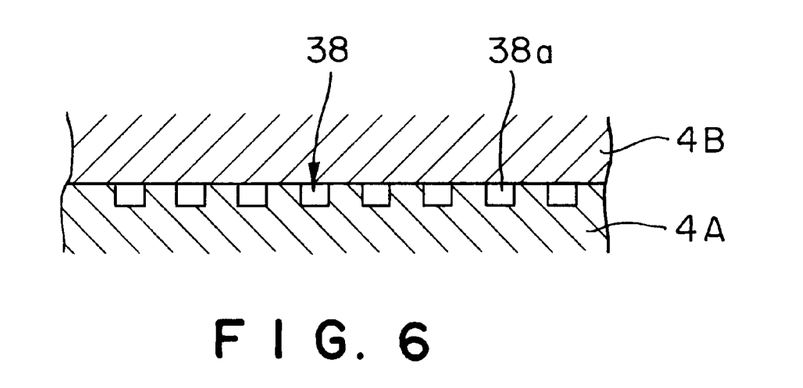
FIG. 6 is a section through another example of the mounting stand used in the vacuum processing apparatus of the present invention.

In the vacuum processing apparatus of the present invention, processing to form recesses and protrusions could be performed on at least one of the linkage surfaces between the adjacent intermediate dielectric plates or on at least one of the linkage surfaces between the second intermediate dielectric plate and the dielectric plate, as denoted by reference numeral 38 by way of example in FIG. 6. With this configuration, indentations 38a form gaps in a vacuum environment, which means that there is substantially no thermal transfer in those portions and thus it is possible to control the degree of thermal transfer. If the dielectric plates are linked together by screws, by way of example, the connective force is larger and the coefficient of heat transfer is greater in the bolted regions, but it is possible to ensure that the coefficient of heat transfer is uniform within each surface by increasing the surface area of protruding portions in regions outside of the bolted regions.

Figure 7:
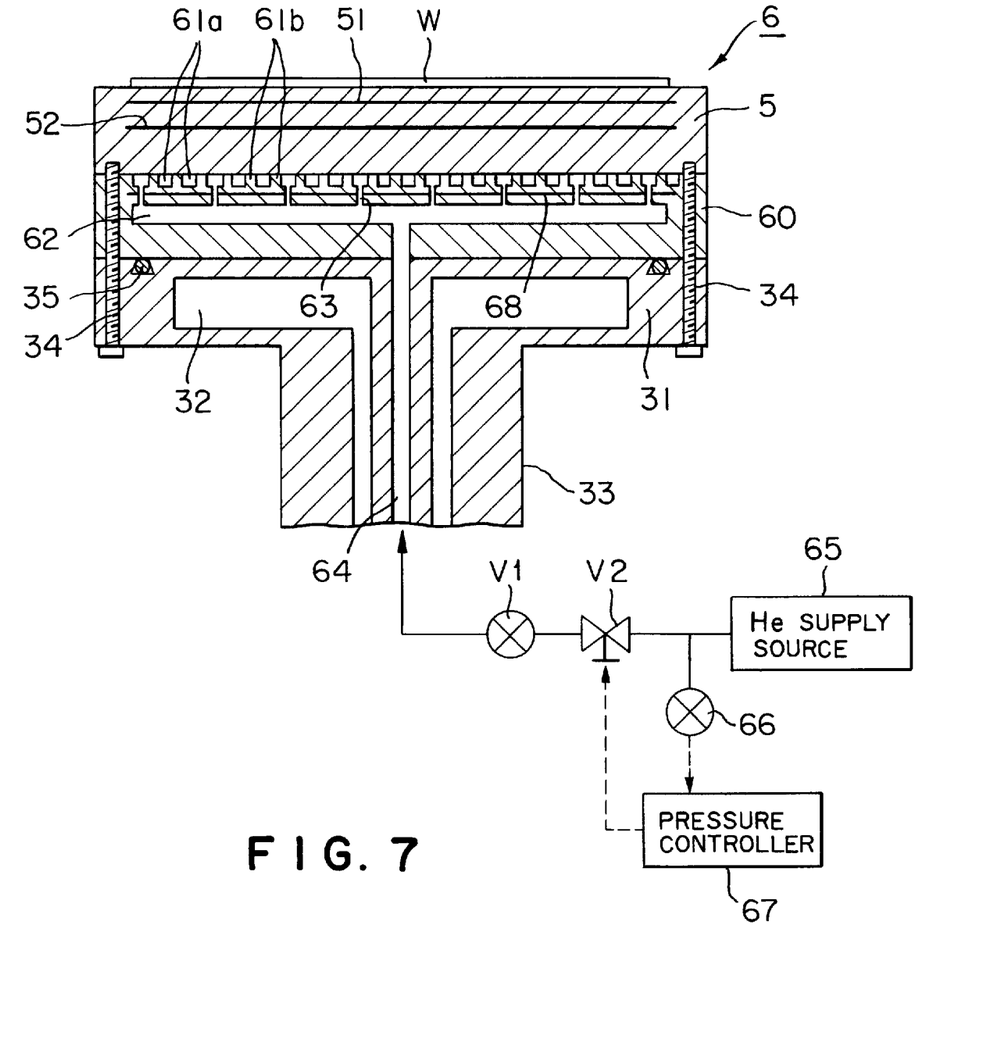
FIG. 7 is a section through a further example of the mounting stand used in the vacuum processing apparatus of the present invention.

The description now turns to a second embodiment of the present invention, with reference to FIG. 7. This embodiment differs from the previously described embodiment in that an intermediate dielectric plate 60 is provided between the cooling portion 31 and the dielectric plate 5 for mounting the wafer W in this mounting stand 6, a heat-transfer gas such as helium fills a gap between the intermediate dielectric plate 60 and the dielectric plate 5, the coefficient of heat transfer between the two plates is adjusted and thus the temperature of the dielectric plate 5 is controlled by adjusting the pressure of this helium, and, as a result, the temperature of the wafer W is controlled thereby.

To describe the mounting stand 6 of this embodiment in more detail: a large number of indentations 61a of a shape such as square columns are formed over substantially the entire surface of the intermediate dielectric plate 60 that is in contact with the dielectric plate 5, recesses and protrusions are thereby formed in this linkage surface, and thus gaps are formed between the intermediate dielectric plate 60 and the dielectric plate 5. In this case, the intermediate dielectric plate 60 and the dielectric plate 5 are linked together via protrusions 61b, and the surface areas of these linkage portions are determined by the temperature difference between the dielectric plate 5 and the cooling portion 31. So they are set to between approximately 20% and 50% of the surface area of the linkage surface of the dielectric plate 5, by way of example. A ventilation chamber 62 is formed within the intermediate dielectric plate 60, and communication between this ventilation chamber 62 and a number of the indentations 61a is provided by ventilation pipes 63.

In addition, a gas supply pipe 64 that extends downwards UL from the center of the mounting stand 6 is connected to the ventilation chamber 62 at a suitable portion such as the base surface thereof, and a helium supply source 65 is connected to the other end of the gas supply pipe 64 outside the mounting stand 6, via a valve V1 and a pressure-adjustment valve V2. This pressure-adjustment valve V2 is configured in such a manner that the pressure in the gas supply pipe 64 between the pressure-adjustment valve V2 and the helium supply source 65 is detected by a pressure gauge 66, by way of example, and the degree of opening of the pressure-adjustment valve V2 is adjusted by a pressure controller 67 on the basis of the detected value. In this embodiment of the invention, the helium supply source 65, the gas supply pipe 64, the ventilation chamber 62, and the ventilation pipes 63 together configure a system for supplying helium into the gap between the dielectric plate 5 and the intermediate dielectric plate 60.

An electrode 68 for an electrostatic chuck is embedded in a position close to the surface of the intermediate dielectric plate 60 so that the surface portion thereof is formed as an electrostatic chuck, in a similar manner to that of the intermediate dielectric plates 4A and 4B of the first embodiment, and the intermediate dielectric plate 60 and the dielectric plate 5 are linked together by this electrostatic chuck.

The surface of the dielectric plate 5 on which the wafer W is to be mounted is formed to have a mirror finish, and peripheral portions of the cooling portion 31, the intermediate dielectric plate 60, and the dielectric plate 5 are linked together in a freely removable way by the screws 34, in a similar manner to that of the mounting stand 3 of the first embodiment. Other details of the configuration are the same as those of the first embodiment.

If the valve V1 of this mounting stand 6 is opened to supply helium from the helium supply source 65 and through the gas supply pipe 64, the helium is supplied from the ventilation chamber 62, through the ventilation pipes 63, and into the indentations 61a. Since the linkage surfaces of the intermediate dielectric plate 60 and the dielectric plate 5 are not completely flat but there are small gaps formed therebetween, the helium then flows through those gaps and disperses throughout all of the gaps between the intermediate dielectric plate 60 and the dielectric plate 5.

Figure 8:
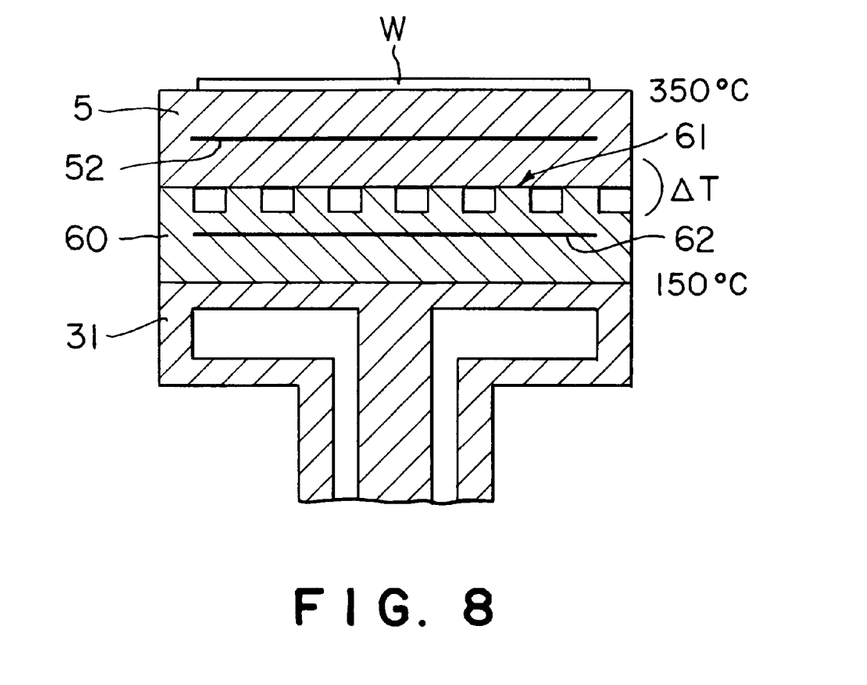
FIG. 8 is a view illustrating the operation of the mounting stand.

If helium is supplied in this manner, heat is transferred between the intermediate dielectric plate 60 and the dielectric plate 5 by the helium, and the coefficient of heat transfer between these two components varies with the pressure of the helium. In other words, the coefficient of heat transfer therebetween depends on the quantity of helium so that, when the pressure of helium within the gaps is high, by way of example, the quantity of gas that acts as a heat-transfer medium is also high and thus the coefficient of heat transfer thereof is high, reducing the temperature difference ΔT (see FIG. 8) between the dielectric plate 5 and the intermediate dielectric plate 60. Conversely, when the pressure of helium within the gaps is low, the quantity of gas that acts as a heat-transfer medium is also low and thus the coefficient of heat transfer thereof is low, increasing the temperature difference ΔT.

Figure 9:
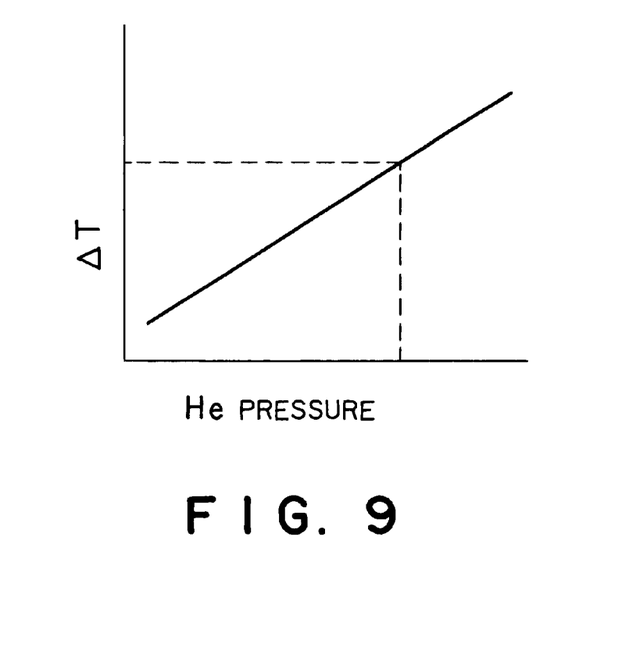
FIG. 9 is a characteristic chart illustrating the operation of the mounting stand.

In this manner, the pressure of helium within the gaps and ΔT are in a proportional relationship as shown in FIG. 9. This helium pressure can be controlled by detecting the pressure within the gas supply pipe 64 by the pressure gauge 66 and then adjusting the degree of opening of the pressure-adjustment valve V2 by the pressure controller 67.

Since the temperature of the wafer W is determined by a balance between the amount of heat supplied from the plasma and. the amount of heat flowing towards the cooling portion 31 from the dielectric plate 5, the temperature of the wafer W can be controlled by adjusting the previously described coefficient of heat transfer. Therefore, since ΔT can be adjusted by adjusting the pressure of the helium in the gaps, which controls the amount of heat moving from the dielectric plate 5 towards the cooling portion 31, the temperature of the surface of the dielectric plate 5 is controlled by a combination of the heating by the heater 52 of the dielectric plate 5 and the plasma together with the cooling of the cooling portion 31, thus controlling the temperature of the wafer W.

The relationship between the pressure of the helium in the gaps and Δ T is obtained beforehand during actual processing, and then the pressure for setting the surface of the dielectric plate 5 to the predetermined temperature is determined on the basis of this relationship, which means that the pressure of the helium within these gaps can be maintained to be within a predetermined pressure range before the wafer W is placed, and thus the temperature of the wafer W can be controlled.

If there is no helium filling the gaps between the dielectric plate 5 and the intermediate dielectric plate 60, those gaps will be in a vacuum environment so that no thermal transfer will occur and thus it will be impossible to impart an adjustable thermal resistance to the gaps, which will make it difficult to control the temperature of the dielectric plate 5.

With this embodiment of the invention, the configuration is such that recesses and protrusions 61 are provided in the surface of the intermediate dielectric plate 60 and helium is supplied thereto, but the recesses and protrusions 61 could equally well be provided on the side of the dielectric plate 5, or they could be formed in both the dielectric plate 5 and the intermediate dielectric plate 60. In addition, the configuration could also be such, that no recesses and protrusions are formed in the linking surfaces of the plates 5 and 60 and helium is supplied into very small gaps that exist in accordance with the degree of flatness of the linking surfaces of the two plates.

Furthermore, the intermediate dielectric plate 60 could be provided with a heater 62 in a similar manner to the intermediate dielectric plates 4A and 4B of the first embodiment, in which case the temperature control can be done even more easily. The helium could also be supplied, not only to the gaps between the intermediate dielectric plate 60 and the dielectric plate 5 but also to gaps between the wafer W and the dielectric plate 5, so that the coefficient of heat transfer can be adjusted by the pressure thereof and thus the temperature of the wafer W can be controlled. Even further, the cooling portion 31, the intermediate dielectric plate 60, and the dielectric plate 5 can be linked together by screws, or the intermediate dielectric plate 60 and the dielectric plate 5 could be linked together by the electrostatic chuck alone.

Figure 10:
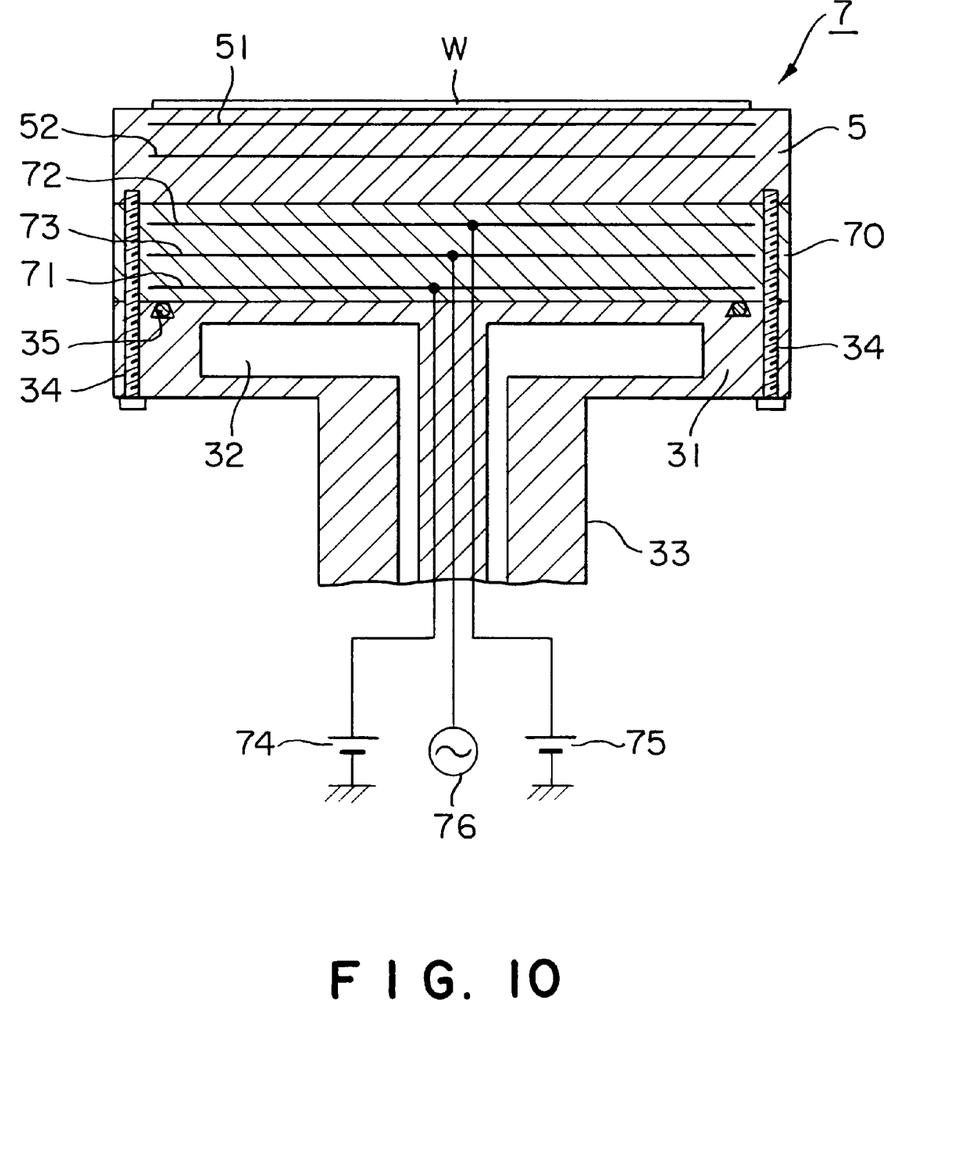
FIG. 10 is a section through an even further example of the mounting stand used in the vacuum processing apparatus of the present invention.

The description now turns to a mounting stand 7 of a third embodiment of the invention, with reference to FIG. 10. The mounting stand 7 in this embodiment has a configuration such that a first electrode 71 for an electrostatic chuck, which is made of a foil of a metal such a tungsten, is embedded in an intermediate dielectric plate 70 mounted on top of the cooling portion 31, at a position close to the surface on the side of the cooling portion 31, and the cooling portion 31 and the intermediate dielectric plate 70 are linked together by the electrostatic force generated by the electrostatic chuck. In this case, a second electrode 72 for an electrostatic chuck, for providing electrostatic attraction to the dielectric plate 5, is embedded in the intermediate dielectric plate 70 on the surface side thereof, in a similar manner to the above described intermediate dielectric plate 4B of the first embodiment, and also a heater 73 is provided as a heating means. The first and second electrodes 71 and 72 are connected to direct-current power sources 74 and 75, respectively, and the heater 73 is connected to a power source 76. The cooling portion 31 and the dielectric plate 5 have the same configuration as in the above described embodiments.

With this mounting stand 7, the cooling portion 31 and the intermediate dielectric plate 70 are linked together by electrostatic force, so that any gaps between the boundary surfaces thereof are reduced. For that reason, in-surface uniformity of the thermal transfer is improved, as previously described, so that heat is transferred in a state in which the temperature of the surface of the cooling portion 31 (the reference temperature) is highly uniform, making it easy to adjust the temperature of the wafer W.

The configuration of this embodiment could also be applied to the mounting stand 6 of the second embodiment. In addition, although this embodiment related to a configuration in which the cooling portion 31 and the intermediate dielectric plate 70 are linked together by a combination of electrostatic force and screws, they could equally well be linked together by the electrostatic chuck alone.

Figure 11:
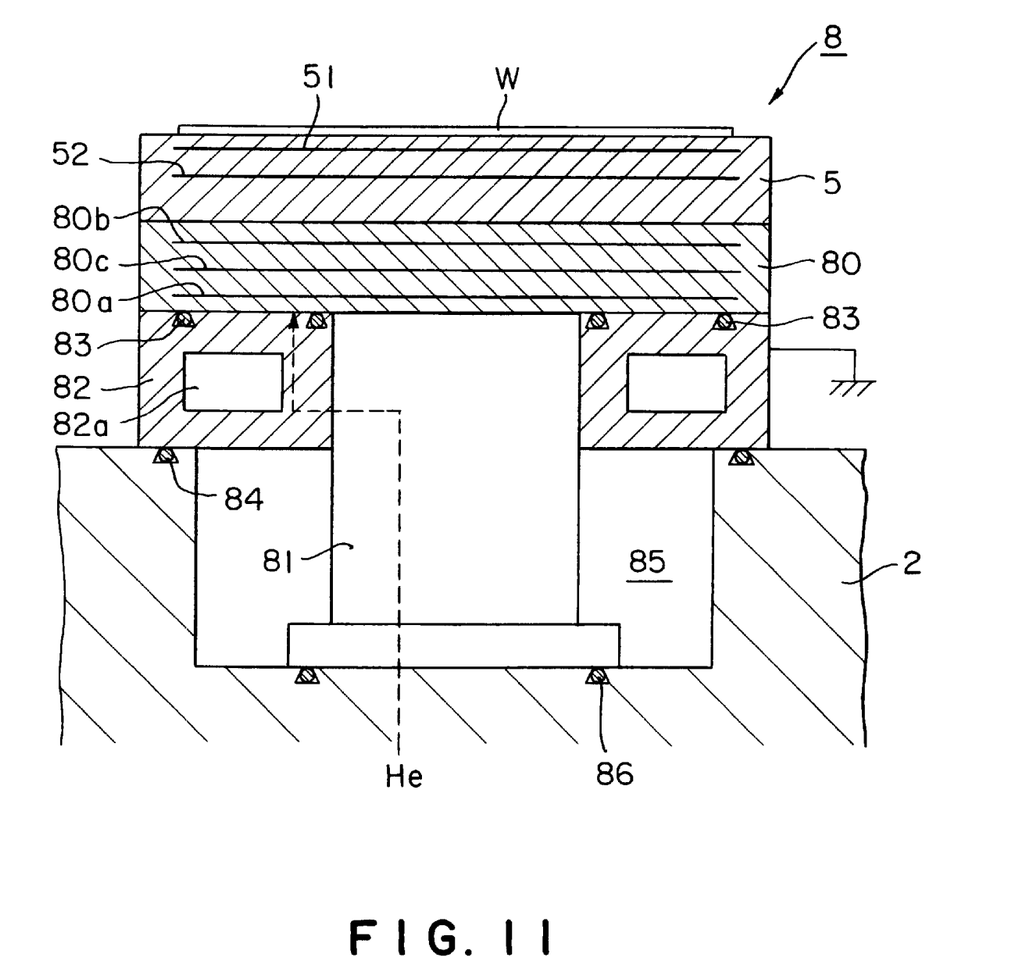
FIG. 11 is a section through yet another example of the mounting stand used in the vacuum processing apparatus of the present invention.
Figure 12:
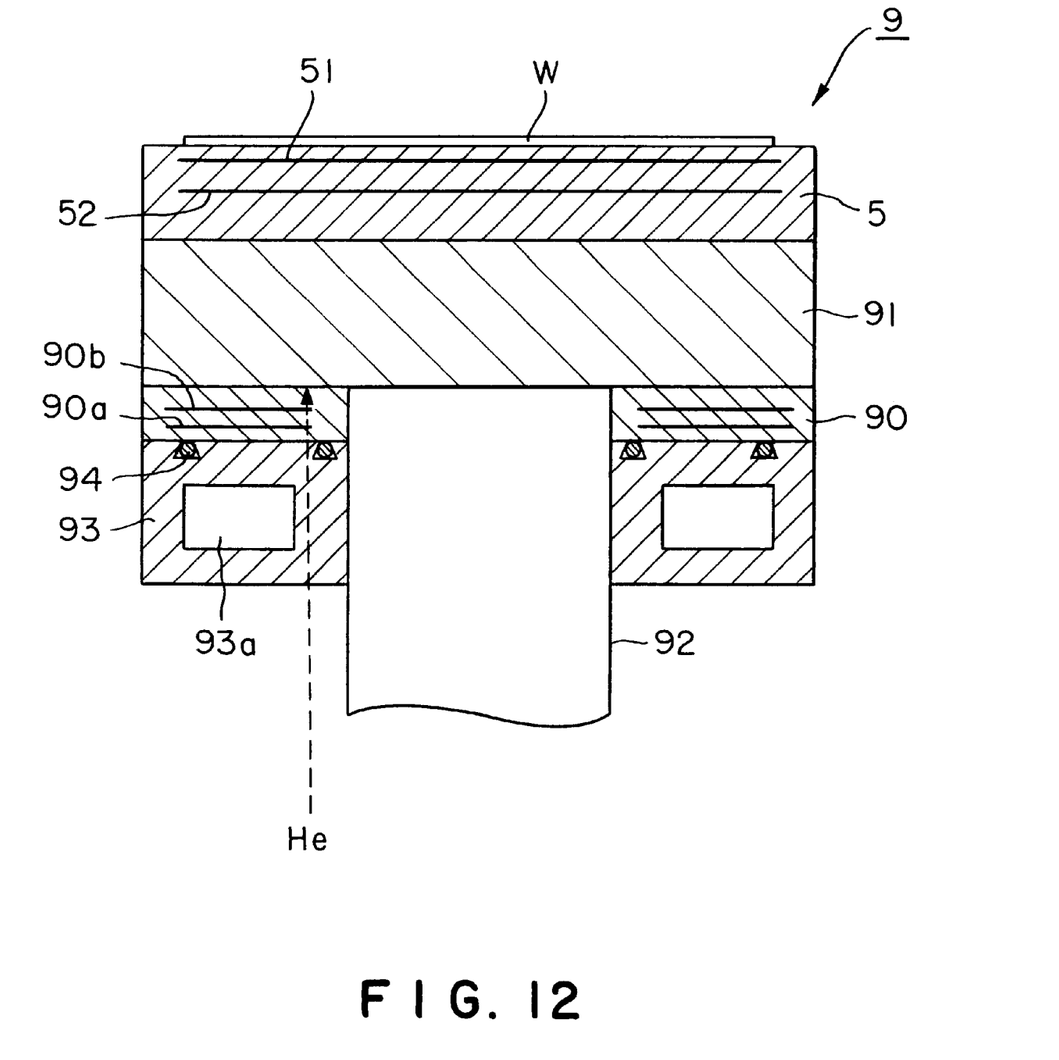
FIG. 12 is a section through still another example of the mounting stand used in the vacuum processing apparatus of the present invention.

The present invention as described above can also be applied to mounting stands 8 and 9 that are shown in FIGS. 11 and 12. The mounting stand 8 shown in FIG. 11 is an example in which a substantially central portion of a bottom surface of an intermediate dielectric plate 80 is supported by a circular cylindrical support member 81 and an annular cooling portion 82 is provided so as to surround the outer periphery of the support member 81, wherein the dielectric plate 5 for mounting the wafer W is provided on the top surface of the intermediate dielectric plate 80.

The cooling portion 82 is made from a material such as aluminum, in a similar manner to the cooling portion 31 of the above embodiments, and is configured in such a manner that it is grounded, a coolant passageway 82a for circulating a coolant is formed in the interior thereof, and the configuration is such that the surface of the cooling portion 82 acts as a uniform reference temperature surface. The configuration is such that the intermediate dielectric plate 80 is provided on the top surface of the cooling portion 82 with a plastic O-ring 83 therebetween, helium is supplied into the linking surfaces of the cooling portion 82 and the intermediate dielectric plate 80 as a heat-transfer gas, and the pressure of the helium is controlled in a similar manner to that of the gas between the intermediate dielectric plate 60 and the dielectric plate 5 of the second embodiment shown in FIG. 7.

Part of the lower surface of the cooling portion 82 is connected to the bottom wall of the vacuum vessel 2, with a plastic O-ring 84 therebetween. In addition, a concavity 85 that matches the base portion of the support member 81 is formed in part of the bottom wall of the vacuum vessel 2, and that the concavity 85 and the bottom surface of the support member 81 are connected together with an O-ring 86 therebetween.

A first electrode 80a for applying electrostatic attraction to the cooling portion 82, a second electrode 80b for applying electrostatic attraction to the dielectric plate 5, and a heater 80c are embedded in the intermediate dielectric plate 80, in a similar manner to the intermediate dielectric plate 70 of the third embodiment. The configuration of the dielectric plate 5 is the same as that of the previous embodiments.

With this mounting stand 8, heat is transferred between the cooling portion 82 and the intermediate dielectric plate 80 by the helium and is transferred between the intermediate dielectric plate 80 and the dielectric plate 5 by the surface contact between those two components.

Since the cooling portion 82 and the intermediate dielectric plate 80 are linked together by the electrostatic attraction of the electrostatic chuck during this time, any gaps between those two components are made smaller, the thermal transfer is done with a high degree of in-surface uniformity, and the coefficient of heat transfer between the two components can be controlled by the pressure of the helium, as previously described. Thus the O-ring 83 and the wafer W are thermally separated, making it possible to provide even easier temperature control to ensure that the temperature of the wafer W is set to a predetermined temperature, while ensuring that there is no deterioration of the O-ring 83 due to heat.

The mounting stand 9 shown in FIG. 12 is an example in which a conductive plate 91 formed of a conductive material such as aluminum is interposed between the dielectric plate 5 and an intermediate dielectric plate 90, a substantially central portion of the bottom surface of the conductive plate 91 is supported by a circular cylindrical support member 92, and the intermediate dielectric plate 90 and a cooling portion 93 are formed to be annular so as to surround the outer periphery of the support member 92.

The cooling portion 93 is made of a material such as aluminum, a coolant passageway 93a for circulating a coolant is formed in the interior thereof, and the configuration is such that the surface of the cooling portion 93 acts as a uniform reference temperature surface. In addition, the intermediate dielectric plate 90 is provided on the top surface of the cooling portion 93 with a plastic O-ring 94 there between.

The configuration is such that the intermediate dielectric plate 90 is provided with a heater 90b and an electrode 90a for applying electrostatic attraction to the dielectric plate 5, helium is supplied into the linking surfaces of the intermediate dielectric plate 90 and the conductive plate 91 as a heat-transfer gas, and the pressure of the helium is controlled in a similar manner to that of the gas between the intermediate dielectric plate 60 and the dielectric plate 5 of the second embodiment shown in FIG. 7. The configuration of the dielectric plate 5 is the same as that of the previous embodiments.

With this mounting stand 9, heat is transferred between the various components by the surface contact between the cooling portion 93 and the intermediate dielectric plate 90, the helium between the intermediate dielectric plate 90 and the conductive plate 91, and the surface contact between the conductive plate 91 and the dielectric plate 5, making it possible to adjust the temperature of the wafer W by a balance between the amount of heat supplied by the plasma and the amount of heat radiated to the cooling portion 93.

In this mounting stand 9, the cooling portion 93 and the intermediate dielectric plate 90 are linked together by the electrostatic attraction of the electrostatic chuck, as are the conductive plate 91 and the dielectric plate 5, so that any gaps between the boundary surfaces thereof are reduced, the thermal transfer is done with a high degree of in-surface uniformity, and also the coefficient of heat transfer between the intermediate dielectric plate 90 and the conductive plate 91 can be controlled by the pressure of the helium. Thus the O-ring 94 and the wafer W are thermally separated, making it possible to provide even easier temperature control to ensure that the temperature of the wafer W is set to a predetermined temperature, while ensuring that there is no deterioration of the O-ring 94 due to heat.

In accordance with the present invention, the intermediate dielectric plate 80 of the mounting stand 8 of FIG. 11 or the intermediate dielectric plate 90 of the mounting stand 9 of FIG. 12 can be configured in the same way as the intermediate dielectric plate 60 of the second embodiment. Similarly, the configuration of the mounting stand 9 of FIG. 12 could be such that the intermediate dielectric plate 4A, 4B or 60 of the first or second embodiment could be provided between the dielectric plate 5 and the conductive plate 91, or an electrode for an electrostatic chuck could be embedded in the intermediate dielectric plate 90, or electrostatic attraction could be induced between the conductive plate 91 and the intermediate dielectric plate 90.

The present invention as described above can also be applied to a vacuum processing apparatus other than an ECR plasma apparatus. In addition, the intermediate dielectric plates of each of the first and second embodiments could be either a single intermediate dielectric plate or a stack of two or more such plates. Furthermore, the configuration could be such that the intermediate dielectric plates of the first embodiment and the intermediate dielectric plate of the second embodiment are provided in a stack. Even furthermore, the intermediate dielectric plates of the first embodiment could be configured without heaters, and a conductive plate could be provided between the dielectric plate 5 of the mounting stand 3 or 6 of the first or second embodiment and the intermediate dielectric plates 4A and 4B or the intermediate dielectric plate 60.

The present invention makes it possible to create any desired temperature difference at a predetermined position within the mounting stand, with respect to the temperature of the mounting surface of the mounting stand, and also enable vacuum processing with a high degree of in-surface uniformity, in such a manner that deterioration of other components such as the O-ring provided in the mounting stand is restrained. Moreover, it makes it possible to adjust the coefficient of heat transfer between the dielectric plate and the intermediate dielectric plate or plates, thus controlling the temperature of the substrate to be processed.

What is claimed is:

1. A vacuum processing apparatus comprising a vacuum chamber and a mounting stand provided within said vacuum chamber for a substrate to be processed, said mounting stand comprising a cooling portion having a cooling means and a dielectric plate provided on top of said mounting stand for supporting said substrate, said supporting dielectric plate including a heater and an electrode that configures an electrostatic chuck for electrostatically attracting said substrate, said vacuum processing apparatus further comprising:
   an intermediate dielectric plate linked to a surface of said cooling portion with an annular synthetic resin sealing member therebetween and having an electrode configuring an electrostatic chuck embedded in a surface thereof;
   a system for supplying a fluid for thermal transfer into a region surrounded by said sealing member between said cooling portion and said intermediate dielectric plate; and
   said supporting dielectric plate being linked to the surface of said intermediate dielectric plate by the electrostatic force of said electrostatic chuck of the intermediate dielectric plate.

2. The vacuum processing apparatus as defined in claim 1, wherein said intermediate dielectric plate is provided with a heater.

3. The vacuum processing apparatus as defined in claim 1, wherein said intermediate dielectric plate is formed of a plurality of intermediate dielectric plate elements, an electrode configuring an electrostatic chuck is embedded in at least one of said intermediate dielectric plate elements, and said intermediate dielectric plate elements are linked together by electrostatic force.

4. The vacuum processing apparatus as defined in claim 1, further comprising a supply system for supplying a fluid for thermal transfer to a linkage surface between said cooling portion and said intermediate dielectric plate, and a device for adjusting a pressure of said fluid for thermal transfer that is supplied to said linkage surface, to control a degree of thermal transfer between said cooling portion and said intermediate dielectric plate.

5. The vacuum processing apparatus as defined in claim 1, further comprising a conductive plate provided between said supporting dielectric plate and said intermediate dielectric plate.

6. The vacuum processing apparatus as defined in claim 1, further comprising:
   a device for supplying a fluid for thermal transfer to a linkage surface between said intermediate dielectric plate and said supporting dielectric plate; and
   a device for adjusting a pressure of said fluid for thermal transfer that is supplied to said linkage surface, to control the degree of thermal transfer between said intermediate dielectric plate and said supporting dielectric plate.

7. A vacuum processing apparatus comprising a vacuum chamber and a mounting stand provided within said vacuum chamber for a substrate to be processed, said mounting stand comprising a cooling portion having a cooling means and a dielectric plate provided on top of said mounting stand for supporting said substrate, said supporting dielectric plate including a heater and an electrode that configures an electrostatic chuck for electrostatically attracting said substrate, said vacuum processing apparatus further comprising:
   an intermediate dielectric plate having an electrode configuring an electrostatic chuck and provided in contact with a surface of said supporting dielectric plate on the opposite side from a substrate support surface of the supporting dielectric plate, said supporting dielectric plate and said dielectric plate being linked together by the electrostatic attraction of said electrostatic chuck of the intermediate dielectric plate;

a system for supplying a fluid for thermal transfer to a linkage surface between said intermediate dielectric plate and said supporting dielectric plate; and a controller for adjusting a pressure of said fluid for thermal transfer to control the degree of thermal transfer between said intermediate dielectric plate and said supporting dielectric plate.

8. The vacuum processing apparatus as defined in claim 7, wherein said intermediate dielectric plate is provided with a heater.

9. The vacuum processing apparatus as defined in claim 7, wherein recesses and protrusions are formed in said linkage surface between said intermediate dielectric plate and said supporting dielectric plate, and gaps through which said fluid for thermal transfer is transferred are formed by said recesses and protrusions.

10. The vacuum processing apparatus as defined in claim 7, further comprising a system for supplying a fluid for thermal transfer to a linkage surface between said cooling portion and said intermediate dielectric plate, and a device for adjusting a pressure of said fluid for thermal transfer that is supplied to said linkage surface, to control the degree of thermal transfer between said cooling portion and said intermediate dielectric plate.

11. The vacuum processing apparatus as defined in claim 7, wherein a conductive plate is provided between said supporting dielectric plate and said intermediate dielectric plate.

12. A vacuum processing apparatus comprising a vacuum chamber and a mounting stand provided within said vacuum chamber for a substrate to be processed, said mounting stand comprising a cooling portion having a cooling means and a dielectric plate provided on top of said mounting stand for supporting said substrate, said supporting dielectric plate including a heater and an electrode that configures an electrostatic chuck for electrostatically attracting said substrate, said vacuum processing apparatus further comprising:

an intermediate dielectric plate provided in contact with a surface of said supporting dielectric plate on the opposite side from a substrate support surface of the supporting dielectric plate; and an electrode configuring an electrostatic chuck that is embedded in said intermediate dielectric plate, for linking together said cooling portion and said intermediate dielectric plate by electrostatic force.

13. The vacuum processing apparatus as defined in claim 12, wherein said intermediate dielectric plate is provided with a heater.

14. The vacuum processing apparatus as defined in claim 12, further comprising a system for supplying a fluid for thermal transfer to a linkage surface between said cooling portion and said intermediate dielectric plate, and a controller for adjusting a pressure of said fluid for thermal transfer that is supplied to said linkage surface, to control the degree of thermal transfer between said cooling portion and said intermediate dielectric plate.

15. The vacuum processing apparatus as defined in claim 12, wherein a conductive plate is provided between said supporting dielectric plate and said intermediate dielectric plate.

16. The vacuum processing apparatus as defined in claim 12, further comprising:

a system for supplying a fluid for thermal transfer to a linkage surface between said intermediate dielectric plate and said supporting dielectric plate; and a device for adjusting a pressure of said fluid for thermal transfer that is supplied to said linkage surface, to control the degree of thermal transfer between said intermediate dielectric plate and said supporting dielectric plate.

* * * * *